United States Patent [19]
Morton

[11] 4,198,612
[45] Apr. 15, 1980

[54] IMAGE ANALYSIS NONLINEAR ADAPTIVE FILTER FOR IMPROVING SIGNAL-TO-NOISE RATIO

[75] Inventor: Roger R. A. Morton, Penfield, N.Y.

[73] Assignee: Bausch & Lomb Incorporated, Rochester, N.Y.

[21] Appl. No.: 868,169

[22] Filed: Jan. 5, 1978

Related U.S. Application Data

[63] Continuation of Ser. No. 627,739, Oct. 31, 1975, abandoned.

[51] Int. Cl.$^2$ .......................... H03H 7/10; H03H 7/14
[52] U.S. Cl. .................................. 333/17 R; 333/174; 333/176; 333/178
[58] Field of Search ................. 333/70 R, 17 R, 17 L, 333/174, 178, 176, 14; 328/167; 307/317 R; 358/36, 155, 167, 282

[56] References Cited

U.S. PATENT DOCUMENTS

| | | | |
|---|---|---|---|
| 2,514,022 | 7/1950 | Bedford | 333/70 R |
| 3,524,081 | 8/1970 | Campanella | 328/167 X |

*Primary Examiner*—Alfred E. Smith
*Assistant Examiner*—Marvin L. Nussbaum
*Attorney, Agent, or Firm*—Frank C. Parker; Bernard D. Bogdon

[57] ABSTRACT

A nonlinear adaptive filter for improving the signal-to-noise ratio of video signals generated from images of features under analysis typically includes filtering components for attenuating low amplitude video noise excursions while passing high amplitude video signal excursions substantially without attenuation. Attenuation of the noise is provided by electrical circuitry operating as a function of the voltage input. In general, the electrical circuitry has a predetermined relationship to the value of the video signal and its noise characteristic.

7 Claims, 12 Drawing Figures

IMAGE ANALYSIS NONLINEAR ADAPTIVE FILTER FOR IMPROVING SIGNAL-TO-NOISE RATIO

This is a continuation of application Ser. No. 627,739, filed Oct. 31, 1975, now abandoned.

BACKGROUND OF THE INVENTION

1. Field of the Invention

This invention relates to an image analysis nonlinear adaptive filter and particularly to a nonlinear adaptive filter having an output whose frequency and attenuation characteristics are a function of the voltage value of the video signal noise characteristic.

2. Brief Description of the Prior Art

As is well known in the communication fields of audio and television transmission, there is often a need to improve the signal-to-noise ratio of the incoming signal. Similar needs extend to the field of image analysis where analog signals representing the image to be analyzed are processed to generate data descriptive of the objects in the image under analysis. In the past, the most common way to generally treat such signals is by the use of linear filters which reduce the overall bandwidth of the signal to make it as narrow as possible without severely degrading the desired signal information. This type of filter has been highly developed and culminates in the areas of filter design, in the optimal linear filter design, Wiener theory applications and other theoretical and practical techniques.

U.S. Pat. No. 3,694,776 entitled "Adaptive Filter Wherein Opposite Conductivity Transistors Are Operative In Response To Signals In Excess Of Predetermined Amplitude" for inventor D. Linder, issued Sept. 26, 1972, discloses a filter adaptive to attenuate as a function of the conduction of a transistor circuit wherein two coupled transistors of opposite polarity respectively conduct as a function of an error signal having an amplitude in excess of a predetermined value. This amplitude is generally unrelated to the peak-to-peak noise characteristic of the incoming signal and there is no provision to adjust this amplitude to match the noise of the incoming signal.

SUMMARY OF THE INVENTION

This invention provides the means to improve signal-to-noise ratio of a signal by attenuating low amplitude excursions while enabling the high amplitude excursions to pass without attenuation. Regulation is accomplished by a backlash circuit operative to conduct and pass high amplitude excursions as a function of voltage variations between the signal at the input and the output signal of the backlash circuit. The backlash circuit operates either by the controlled selection of elements based upon predetermined video signal noise characteristics or automatically through circuitry which operates as a function of the amplitude value of the noise characteristic of the incoming video signal.

DESCRIPTION OF THE PREFERRED EMBODIMENTS

Figure 1:
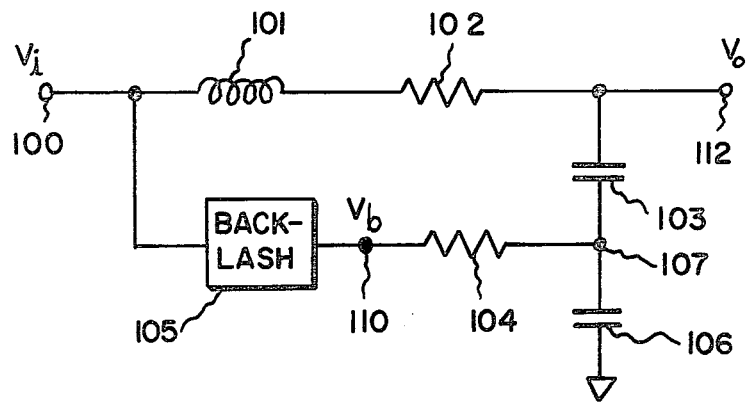
FIG. 1 is a schematic and block diagram illustration of a nonlinear adaptive filter according to the principles of the present invention.

FIG. 1 illustrates a basic schematic and block diagram outline circuit of an inventive nonlinear filter system. An analog input signal $V_i$, for example, the described signal for line 13 of FIG. 3 of U.S. Pat. No. 3,805,028, issued Apr. 16, 1974 for inventor R. R. A. Morton entitled "METHODS OF AND APPARATUS FOR DETERMINING THE QUANTITY AND PHYSICAL PARAMETERS OF OBJECTS", comes in at terminal 100 and passes to an inductor 101 and a resistor 102, which in conjunction with capacitors 103 and 106 form a two pole low pass LC filter circuit when connection 107 between capacitors 103 and 106 is an open circuit. For this condition the frequency response and characteristics of this filter circuit are generally well known and specifically can be easily computed. In the present inventive system, however, a backlash circuit 105 connects through resistor 104 to connection 107 to provide an alternate filter path which operates when analog amplitude excursions are high.

Figure 2A:
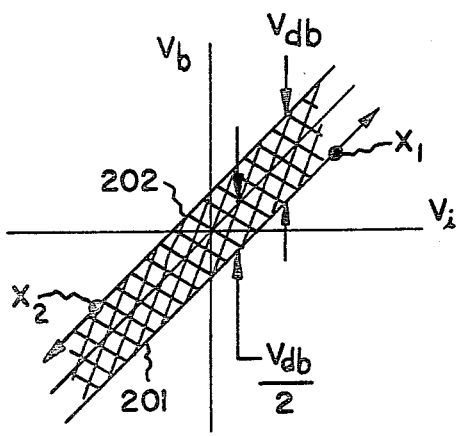
FIG. 2a is a graphical representation of the response of the voltage output of the control element of the filter of FIG. 1.
Figure 2B:
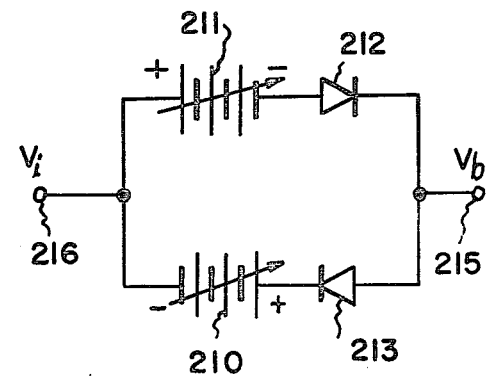
FIG. 2b is a schematic illustration of an idealized embodiment of the control element of the filter of FIG. 1.

Details of an idealized embodiment of such a backlash circuit are described, for example, with respect to FIGS. 2a and 2b. The characteristics of the backlash circuit are as shown in FIG. 2a where the input voltage $V_i$ at terminal 100 is plotted against the backlash circuit output voltage $V_b$ at terminal 110. In general, according to the principles of the invention, the maximum difference permitted to exist between $V_i$ and $V_b$ is half the deadband voltage $V_{db}$, which voltage value corresponds to the vertical measurement of the cross hatched area of FIG. 2a. The amplitude value of the deadband voltage $V_{db}$ is selected to be a value within which the peak value of the noise desired to be attenuated falls, for example, 95% of the time. Furthermore, when $V_i$ is increasing, $V_b$ is forced by current flowing through diode 212 in the backlash circuit of FIG. 2b, to be no less than the value defined by line 201 which is given as half the deadband voltage $V_{db}$ below the diagonal straight line which defines the output voltage of $V_b$ to be equal to the input voltage $V_i$.

Similarly, when $V_i$ is decreasing, the voltage $V_b$ at the output is forced by current flow through diode 213 to be no greater than the voltage along line 202 which line is similarly determined as being half the backlash voltage above the diagonal line which defines the output voltage $V_b$ as equal to the input voltage $V_i$.

In most configurations of the backlash circuit, the output terminal, for example, point 215 in FIG. 2b, at which $V_b$ appears, is connected either directly or indirectly to a capacitor, for example, capacitor 106 in FIG. 1. This capacitor holds the voltage $V_b$ at the output terminal 110 of FIG. 1, to a value within $V_{db}/2$ of $V_i$, whenever, for example, diodes 212 and 213 are not conducting. However, when either of these diodes is conducting, the voltage $V_b$ at the output terminal is determined by the voltage at the input terminal 216 in FIG. 2b plus or minus half the deadband voltage depending on whether the input voltage $V_i$ is increasing or decreasing. This output voltage $V_b$ determines the voltage on either capacitor 103 or capacitor 106 of FIG. 1.

The embodiment of the backlash circuit 105, as seen in FIG. 2b is an idealized representation of a backlash circuit which may be incorporated into the circuit of FIG. 1. Two batteries 210 and 211, whose voltage may be adjusted, generate a D.C. voltage and each is adjusted to be equal to half the deadband voltage $V_{db}$ corresponding approximately to the expected peak-to-peak amplitude of noise in the incoming signal. Depending on the frequency characteristics of the signal, the noise and the other components of the filter, the optimum amplitude of the deadband voltage may differ somewhat from exactly half the peak-to-peak amplitude.

The idealized diode 212 conducts current whenever the forward voltage across it exceeds zero and does not conduct current otherwise. Thus, whenever the input voltage $V_i$ of input terminal 216 tends to exceed the output voltage $V_b$ at output terminal 215 by more than the voltage of the battery 211, such as at point $X_1$, of FIG. 2a, current flows between input 216 and output 215 to cause output voltage $V_b$ at point 215, to follow the input voltage $V_i$ within a difference of half the deadband value. Similarly, if $V_i$ tends to be less than $V_b$, by the voltage of battery 210, such as at point $X_2$ of FIG. 2a, then current again flows between input 216 and output 215, this time through ideal diode 213 to similarly cause the output signal $V_b$ to follow the input signal $V_i$.

When the backlash circuit output voltage $V_b$ at terminal 215 falls within the cross-hatched deadband area of FIG. 2a, the output impedance of the backlash circuit 105 becomes very large, since in the case of the circuit of FIG. 2b neither diode 212 or 213 conducts and the backlash circuit between terminals 215 and 216 appears as an open circuit. Under these conditions the backlash circuit has no effect on the backlash output voltage $V_b$ and $V_b$ is therefore determined by external components as hereinbefore mentioned. Thus in FIG. 1, when the backlash circuit impedance is high, the backlash output voltage $V_b$ is being determined by filter components 101, 102, 103, 104 and 106, connected to the terminal 110 at the output of backlash circuit 105.

Under these conditions a video analog signal having frequency components lower than the anticipated noise frequency is passed and the noise and lower amplitude excursions are attenuated.

Figure 3:
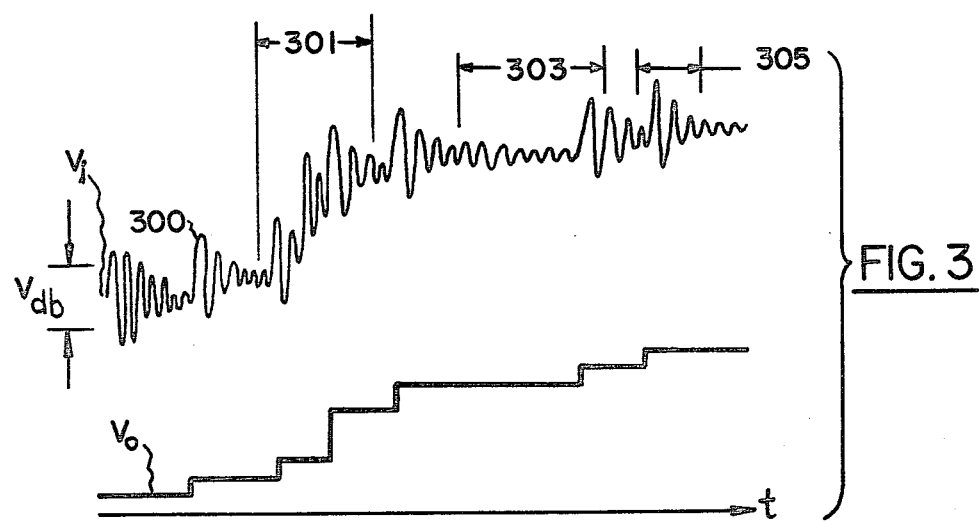
FIG. 3 is a graphical illustration of a noise carrying video signal and a filtered video signal.

The practical operation of the filter circuit of FIG. 1 can be understood with reference to the analog signal of FIG. 3. Such an analog signal is of the video type generated, for example, in an embodiment according to the principles of the invention of the hereinbefore mentioned U.S. Pat. No. 3,805,028. As shown in FIG. 3, the input voltage represented by the voltage line 300, has a positive transition 301 whose amplitude, for illustrative purposes, will be defined as being much greater in value than the value of a deadband voltage $V_{db}$. Note that it has been described so far that the high impedance state of the backlash circuit occurs for a deadband voltage range which is symmetrical about zero. Consider also that in the embodiment of FIG. 2a, the upper half of the deadband range corresponds to the voltage established by battery 211 in FIG. 2b and the lower half to the voltage of battery 210. Thus, the sum of the voltages of batteries 210 and 211 correspond to deadband voltage $V_{db}$ shown in FIG. 2a. Once the positive transition of the incoming signal $V_i$ has risen farther than $V_{db}/2$ from its initial value, the backlash output signal $V_b$ tracks the noise peaks of the input voltage level due to the action, as already described, of the diodes in the backlash circuit of FIG. 2b. The output voltage 112 of FIG. 1, assuming for this consideration that resistor 104 has a negligibly small resistance value, will consequently rise, following point 107 on the peaks of the input voltage $V_i$ at point 100 as represented by the waveform of FIG. 3. Thus, the rate of rise of the amplitude of the filter output voltage $V_o$ at point 112 approximates the rate of rise of the input voltage $V_i$ at point 100.

Now, consider the response of the filter output voltage $V_o$ during a constant signal amplitude section of the incoming signal $V_i$ as occurs, for example, during time range 303 in the illustration of FIG. 3. The incoming signal $V_i$ contains noise as illustrated by signal variations 304. If the noise has a peak amplitude value which, for example, for 95% of the time, falls within the amplitude value of the deadband voltage range $V_{db}$, then the voltage at terminal 107, in the filter of FIG. 1, will fall near the mid-range of this noise or namely at an amplitude level approximately corresponding to the average amplitude level of the incoming video signal $V_i$ during the time period 303.

Consequently, the action of the backlash circuit 105 causes the amplitude value of the voltage at terminal 107 to be stationary almost all of the time during period 301 of FIG. 3 because the input voltage $V_i$ will fall within the deadband voltage range $V_{db}$. Thus, terminal 107 will be effectively connected to ground through capacitor 106 and the effective circuit bandwidth from input voltage $V_i$ to filter output voltage $V_o$ will be determined by the linear filter comprising components 101, 102, 103 and 106 of 1. Because this linear filter can be designed to have an effective bandwidth far narrower than the incoming noise, it will effectively attenuate all noise in the normal manner of a linear filter.

Thus, the bandwidth of the filter for a small amplitude of noise, can, for the range of noise amplitude, be made much narrower than the filter bandwidth for the incoming signals $V_i$. This filter bandwidth is effectively determined by components 104 and 106. Thus, while a small amplitude is subject to the narrower bandwidth, the larger amplitude incoming signals $V_i$ appear to be substantially unaffected by the narrower bandwidth. Consequently, a substantial improvement in signal-to-noise attenuation is achieved by reducing the noise amplitude, while substantially preserving the fidelity of the incoming signal.

Consider the response of the circuit to incoming signal perturbations smaller in amplitude than the noise. In general, since the voltage at terminal 107 corresponds to the average value of the noise, provided that the deadband amplitude of $V_{db}$ approximately corresponds to the peak-to-peak value of the noise, the noise will force the voltage at terminal 107 to be at the average value, or more specifically, at the value which lies approximately midway between peak-to-peak amplitude limits of the noise. Thus, small perturbations of amplitude, less than $V_{db}$ from the average level, as shown in FIG. 3 over the time range 305, will be followed effectively on the peaks of the noise by filter output signal $V_o$.

To obtain the desired characteristics, the following conditions are set forth with respect to the values of the components for the circuit. The bandwidth of the filter formed by resistor 104 and capacitor 106 corresponds to or is wider than the bandwidth of the incoming signal $V_i$, and the bandwidth of the filter formed by components 101, 102, 103 and 106 is much narrower than the incoming $V_i$ signal bandwidth, and corresponds to the noise filtering bandwidth. Further, the value of capacitor 103 is of the same order or less than the value of the capacitor 106. A final requirement, already stated, is that the deadband range $V_{db}$ be of the same order as the peak-to-peak value of the incoming noise. The peak-to-peak value is typically defined as the voltage range within which the noise lies for approximately 95% of the time period.

In many applications noise amplitude is consistent and the deadband amplitude $V_{db}$ is adjusted to give the most accurate output signal in response to the input while reducing the noise and amplitude at the output. Such an adjustment technique ensures that the amplitude of the noise is taken into account when adjusting the deadband.

These nonlinear filters using backlash techniques have been found to be most applicable on noise whose amplitude distribution tends to be rectangular in shape and whose spectral response is uniform or has peaking at higher frequencies. However, noise having the more common Gaussian amplitude distribution with a wide or uniform frequency spectrum will be very effectively attenuated by this filter.

This filter is most effective in improving the signal-to-noise ratio when the incoming signal-to-noise ratio is relatively high.

Figure 4:
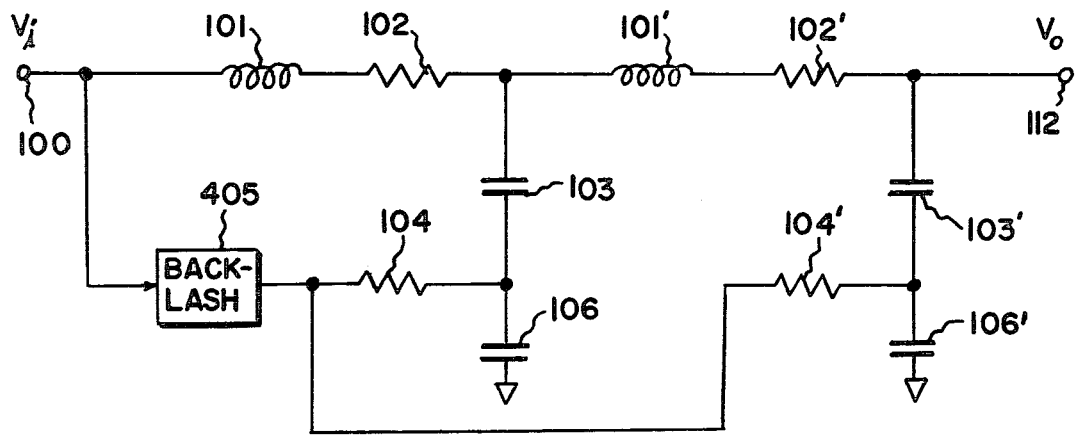
FIG. 4 is another schematic and block diagram illustration of a nonlinear adaptive filter according to the principles of the present invention.

Many different nonlinear filter configurations can be built using the principles outlined above. FIG. 4 shows a multi-stage filter in which the backlash circuit 405 drives a number of successive complementing filter sections. The backlash circuit 405 provides a path through resistor 104' and capacitor 103' to output 112 for the higher amplitude signals, while the smaller main signals are attenuated by the two section filter comprising components 101, 102, 103 and 106 for the first section and 101', 102', 103' and 106' for the second section. Resistors 104 and 104' determine the large signal bandwidth in conjunction with capacitors 106 and 106', respectively.

Figure 5:
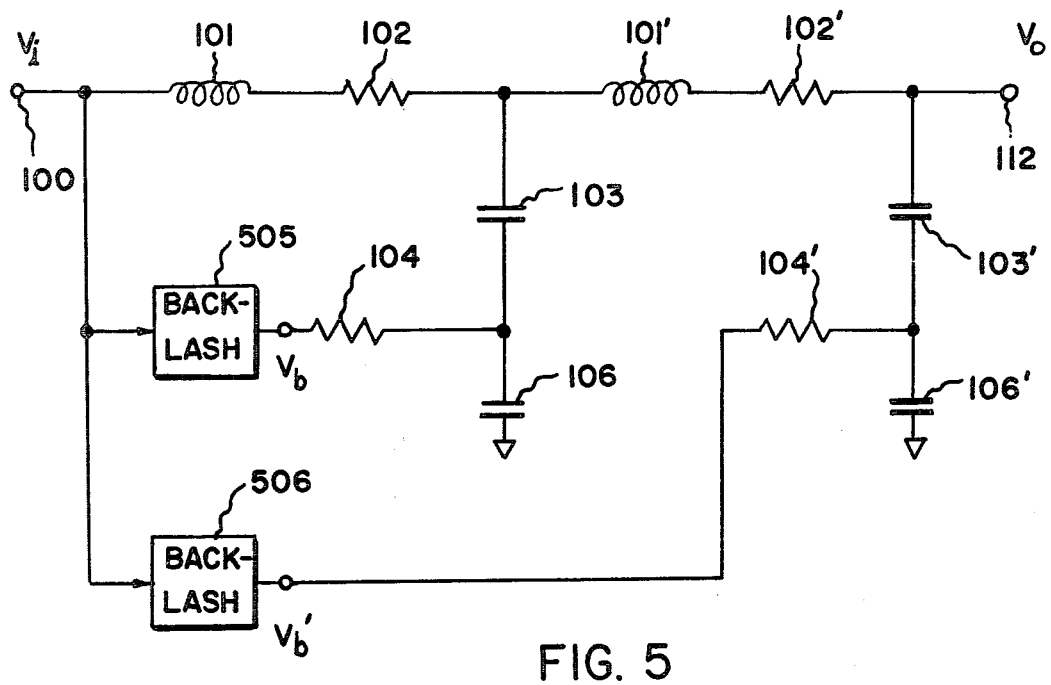
FIG. 5 is still another schematic and block diagram illustration of a nonlinear adaptive filter according to the principles of the present invention.

Alternatively, filter circuits, such as shown in FIG. 1, can be placed in series with separate backlash circuits associated with each filter section. This is shown in FIG. 5 with two backlash circuits 505 and 506.

It will be appreciated that the electronic dual of these filter configurations corresponding to the appropriate substitutes, for example, current instead of voltage and admittance instead of impedance, can also be designed using similar techniques.

Figure 6:
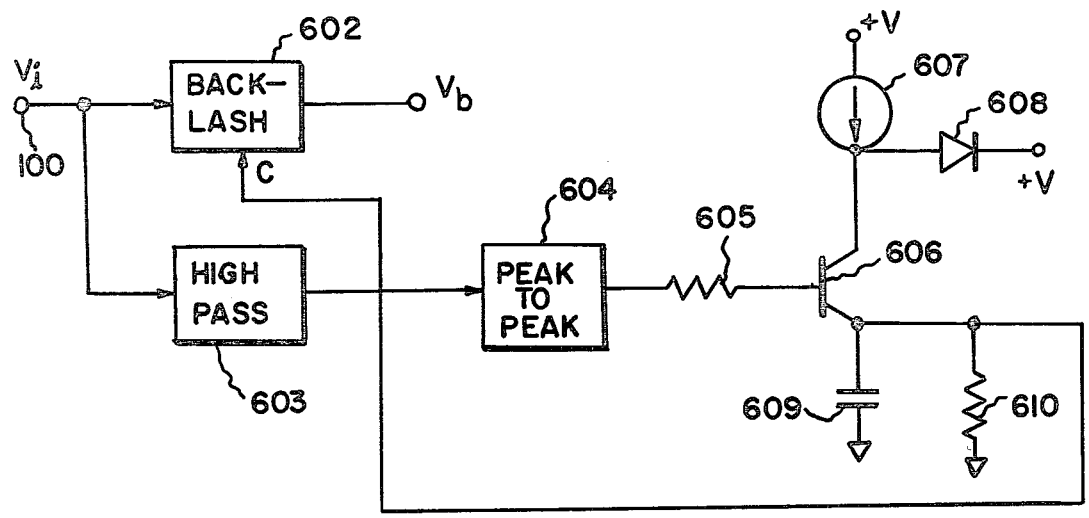
FIG. 6 is an additional schematic and block diagram illustration of a nonlinear adaptive filter according to the principles of the present invention including automatic detection of the noise characteristic.

In an alternate configuration of the filter circuit, the backlash circuit has an additional input at control terminal marked C, as illustrated in FIG. 6. An input line 601 is connected to backlash circuit 602 and the voltage at terminal C, with respect to ground, corresponds to the desired backlash voltage $V_{db}$. A circuit comprising a high pass filter 603 to detect the high frequency noise in the signal is fed to a peak-to-peak detector 604 to produce a voltage proportional to the peak-to-peak noise across a load resistor 605.

However, the rate of rise in response to each point is limited to the current available from current source 607 to charge capacitor 609, thereby filtering out any sudden excursions in the signal from peak-to-peak detector. Such sudden excursions may arise from rapid transitions of the incoming signal at point 100 of FIG. 6.

Resistor 605 is connected to an emitter-follower transistor 606 which is driven at its collector by a fixed current source 607. A diode 608 controls the upper voltage level on the collector of transistor 606. The current passed to a integrating capacitor 609 and a bleeder resistor 610, generates a voltage substantially corresponding to the peak-to-peak noise voltage with little effect from the large excursions of the incoming signal. This correction voltage is then fed back to the backlash circuit 602 at terminal C to ensure that the width of the deadband is correlated with the varying noise amplitude. This provision for adjusting the size of the deadband is not always necessary because in many applications, noise amplitude can be assumed to be constant or vary only over a limited range. The high pass filter is typical and may comprise a resistor capacitor network. The peak-to-peak detector may comprise a diode capacitor combination connected in the conventional manner.

Figure 7:
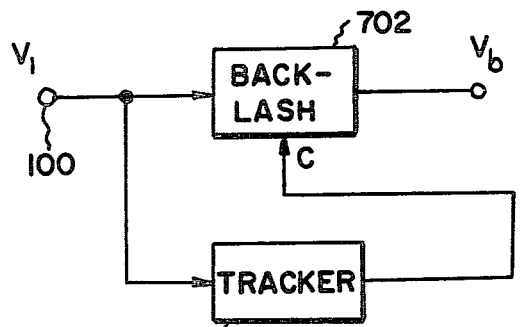
FIG. 7 illustrates an alternate embodiment of the invention illustrated in FIG. 6.

Another application of the filtering technique arises when the noise amplitude is not constant and the noise is due to electron shot noise or other discrete events. In such cases, the noise amplitude varies, for example, as the square root of the actual signal amplitude and this variation can be tracked, for example, by a nonlinear tracker circuit 701. This nonlinear circuit, which may be implemented using diodes connected to a series of fixed voltages, would, for example, approximate a square root function, so that the amplitude of the output voltage would correspond to the square root of the amplitude of the input voltage. Thus, the signal generated by the tracker circuit 701 corresponds to the expected peak-to-peak noise amplitude derived from the actual amplitude of the incoming signal $V_i$ which is fed back to the backlash circuit 702 at the control terminal C. It should be appreciated that the combination of backlash and backlash control circuits of both FIGS. 6 and 7 will be connected, in place of the backlash circuit shown in FIGS. 1, 4 or 5 at terminal points marked $V_i$ or $V_i'$ and $V_b$ or $V_b'$ to form the complete filter circuit.

Figure 8:
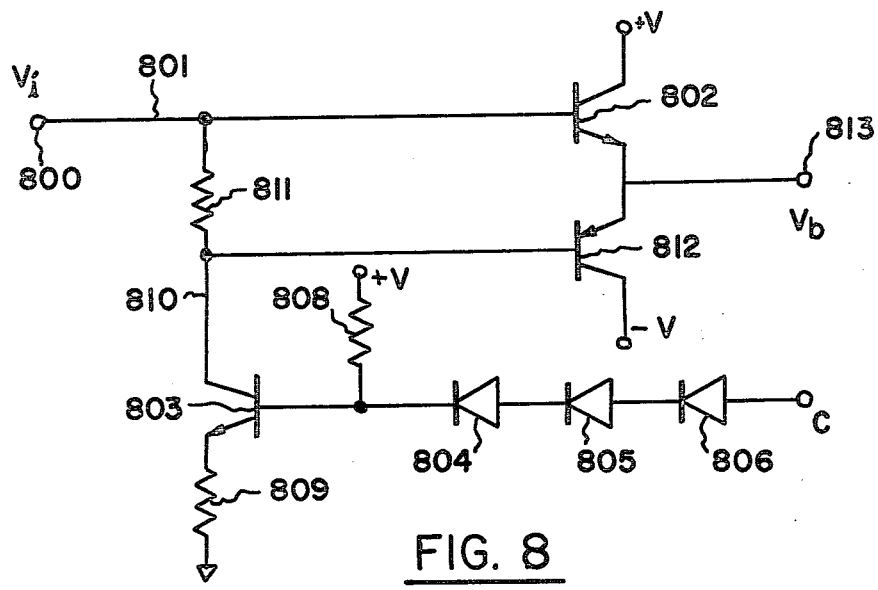
FIG. 8 is a schematic illustration of the implementation of the backlash function of the filters of FIGS. 6 and 7.

A variety of circuitry implementations can be considered for the backlash circuits of FIGS. 1, 4, 5, 6, 7 and 11. The circuit of FIG. 2a would adapt to the filter circuits of FIGS. 1, 4, 5 and 11. FIG. 8 shows one possible circuit implementation, for example, for the circuit 602 of FIG. 6 or circuit 702 of FIG. 7. The incoming signal $V_i$ enters at terminal 800 on line 801 and passes to the base of transistor 802 which is connected in an emitter-follower configuration without a load resistor. A transistor 803 receives, through serially connected diodes 804, 805 and 806, connected to control terminal C the signal to modify the deadband range $V_{db}$. The serially connected diodes act to provide temperature compensation for variations with temperature of the base emitter voltage of the transistors. Transistor 803 generates in line 810, with the aid of resistor 808 and 809, a current related to the required deadband range. This current in line 810 develops a voltage drop across resistor 811 to cause transistor 812 to have at its base a signal having the same alternating current characteristics as the signal on the base of the transistor 802, but offset by an adjustable amount related to the required deadband. The offset adjustment is accomplished by varying the current in resistor 811 by means of the voltage at point C using transistor 803 as a voltage to current converter, due to resistor 809. The output impedance at output terminal 813 of the backlash circuit, effectively has a very high source impedance when the voltage $V_b$ at terminal 813 lies within the backlash range with respect to the input signal $V_i$.

One variation in the characteristic of the circuit of FIG. 8 from the circuit shown in FIG. 2a, is that the deadband is assymmetrical about the zero voltage. However, this is of little consequence, since in using the backlash circuit, for example in the circuit of FIGS. 1, 4 and 5, there is only alternating current coupling between the backlash circuit output voltage $V_b$ and the output filter voltage $V_o$.

Figure 9:
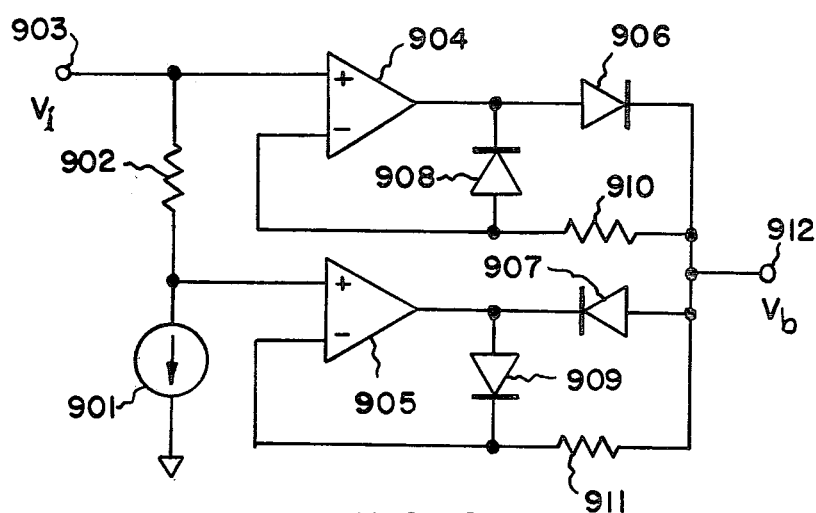
FIG. 9 is another embodiment of the backlash circuit of the filters of FIGS. 6 and 7.

FIG. 9 illustrates a further backlash circuit using operational amplifiers and is useful, for example, in the filter circuits of FIGS. 1, 4 and 5. The deadband amplitude range is determined by current generator 901 feeding current to resistor 902 to develop a voltage offset with respect to the incoming voltage $V_i$ at terminal 903. The current generator 901 of FIG. 9 is equivalent in function to the combination of resistor 809, transistor 803, resistor 808 and diodes 804, 805 and 806 of FIG. 8. Thus, if an adjustable deadband is required the current generator must be so designed that the offset voltage is split between operational amplifiers 904 and 905. Diodes 906 and 907, respectively, ensure that each operational amplifier can only make a unidirectional contribution to the current. When either operational amplifier attempts to make a contribution in a direction reverse to the direction of diodes 906 or 907, diodes 908 and 909 tend to catch, through feedback operation, the large swing that would otherwise appear at the operational amplifier outputs. The unity feedback signal passes back to resistors 910 and 911 and the output voltage $V_b$ of the backlash circuit appears at output terminal 912. Resistors 910 and 911 have a high value of resistance so that output 912 appears to have a high impedance whenever diodes 906 and 907 are reverse biased. Like the circuit shown in FIG. 8, the circuit of FIG. 9 provides an assymmetrical deadband. As already mentioned, this is quite satisfactory in many applications. Moreover, if a symmetrical deadband range is required it is necessary to employ two adjustable current sources.

Figure 10:
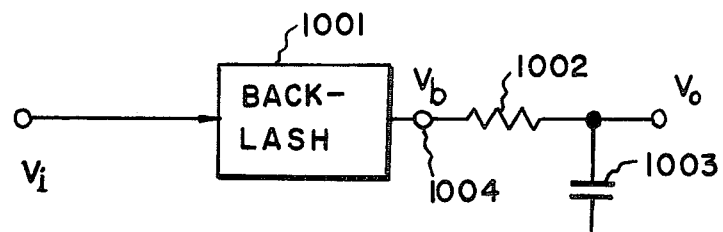
FIG. 10 is a simplified adaptive filter according to the principles of the present invention.

A circuit configuration simplier than that of FIGS. 1, 4, 5, 6 or 7, in which the backlash circuit can be used to provide an improvement signal-to-noise, is shown in FIG. 10. The backlash circuit 1001 receives the video input signal $V_i$ and its output voltage $V_b$ appears at terminal 1004 on resistor 1002. The resistor 1002 in conjunction with capacitor 1003 form a filter whose bandwidth exceeds the bandwidth necessary to pass the signal information. Consequently, noise is rejected purely on its amplitude properties, since there is no alternate path. Thus, if backlash 1001 does not conduct, all low amplitude excursions are cut off.

If it is desired to provide an alternate path to let some frequency component of the low amplitude signals pass, a resistor may be connected between the points marked $V_i$ and $V_b$. Consequently, the value of that resistor plus resistor 1002 in conjunction with capacitor 1003 will determine the low amplitude bandwidth of the circuit.

Figure 11:
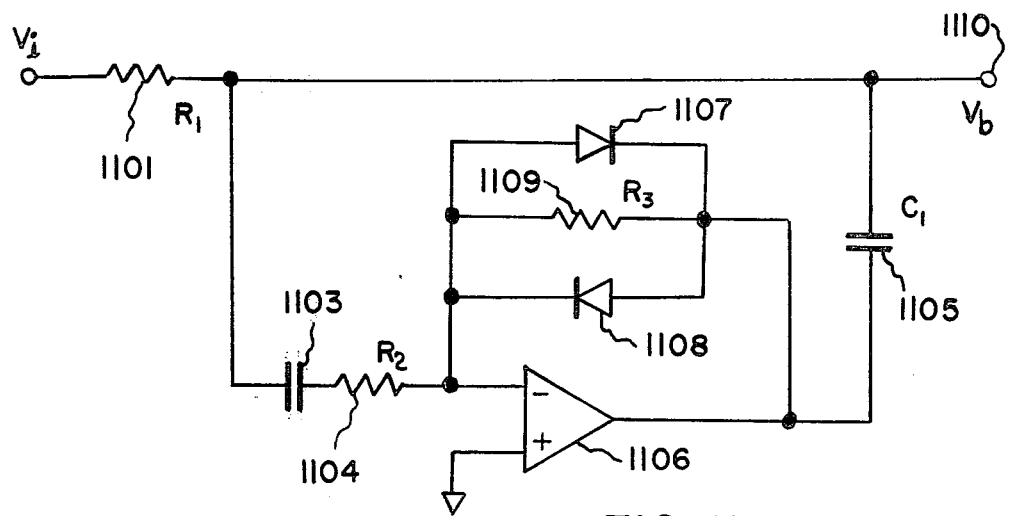
FIG. 11 is still another embodiment of a filter adapted for small amplitude signals according to the principles of the present invention.

FIG. 11 shows one of a number of possible alternative implementations of this inventive principle. There a nonlinear filter designed for small amplitudes is implemented by $R_1$ resistor 1101 and $C_1$ capacitor 1105. The apparent value $C_a$ of capacitor 1105 is increased by the closed loop gain of the negative feedback amplifier 1106 and related components. Capacitor 1103 provides AC coupling so that a quiescent voltage may be established near zero volts of the output of the amplifier 1106. Resistor $R_2$ provides a suitable input impedance to the closed loop amplifier 1106.

Resistor $R_3$ determines the small signal gain of the amplifier 1106.

The apparent value of $C_1$ capacitor 1105 due to the feedback computation is given approximately by $(1+R_3/R_2)C_1$. However, in response to large signal swings, either diode 1107 or diode 1108 conducts and the gain of the amplifier is approximately unity. At such time the apparent value $C_a$ of capacitor 1105 at terminal 1110 is reduced to $2C_1$. Thus, the value of the bandwidth of the filter is determined by the time constant $R_1 C_a$. The deadband amplitude $V_{db}$ of this circuit of FIG. 11 is approximately given by $2V_fR_2/R_3$ where $V_f$ is the foward voltage of the diodes 1107 and 1108.

While there have been described the preferred embodiments of this invention at the present time, it should be obvious to those skilled in the art that changes and modifications can be made thereto without departing from the spirit and scope of the invention.

It is claimed:
1. An image analysis nonlinear adaptive filter receiving a video signal having analog voltage amplitude excursions generated as a function of line scanning across features of an image for providing a filtered output signal substantially attenuated of video signal noise characteristics represented by small amplitude excursions of a predetermined peak-to-peak amplitude value of the video signal, comprising:
   filter circuit means having an input connected to receive the video signal and an output for providing a filtered output signal attenuated of amplitude excursions of the video signal which are less than a predetermined peak-to-peak amplitude value of the video signal at the input whenever the magnitude of the difference between the input and the output of the filtered circuit means is less than a predetermined value which is a function of the peak-to-peak amplitude value of the video signal noise characteristic to be attenuated; and
   circuit control means having an input connected to receive the video signal and an output connected to pass a modified received signal to the output of said filter circuit means whenever the magnitude of the difference of the amplitude of the video signal at the input and the amplitude at the output of the filter circuit means exceeds the predetermined value which is a function of the predetermined peak-to-peak amplitude value of the video signal noise characteristics attenuated so that the filtered output signal which is substantially attenuated of video signal noise characteristics represented by small amplitude excursions of the predetermined peak-to-peak amplitude value of the video signal does not differ from the video signal by more than an amount related to the predetermined value.

2. The image analysis nonlinear adaptive filter as defined in claim 1, wherein the circuit control means includes two parallel electrical circuits of opposite polarities, each of which respectively conducts whenever the video signal voltage tends to differ from the voltage at the output of the filter circuit means by more than a value substantially equal to one half of the predetermined peak-to-peak value of the video signal noise characteristic.

3. The image analysis nonlinear adaptive filter as defined in claim 2, wherein each of the parallel electrical circuits includes a voltage source having a value substantially equal to one half of the predetermined peak-to-peak value of the video signal noise characteristic.

4. The image analysis nonlinear adaptive filter as defined in claim 3, wherein each of the parallel electrical circuits further includes diodes.

5. The image analysis nonlinear adaptive filter as defined in claim 1, further including peak-to-peak circuit means to determine the peak-to-peak amplitude value of the video signal noise characteristic by generating a signal as a function of the high frequency content of the video signal which is received by the circuit control means for controlling the filter circuit means.

6. The image analysis nonlinear adaptive filter as defined in claim 1, wherein the circuit control means further includes temperature circuit means to compensate for temperature variations in the filter circuit means by generating a control signal as a function of the temperature variations of the filter circuit means for controlling the filter circuit means to provide a temperature compensated filtered output signal from the filter circuit means.

7. Image analysis nonlinear adaptive filter circuitry receiving a video signal having analog voltage amplitude excursions generated as a function of line scanning across features of an image for providing a filtered output signal with attenuated noise characteristics represented by small amplitude excursions of the received video signal of a predetermined peak-to-peak amplitude value, comprising:

circuit control means having an input to receive the video signal and an output to generate a control signal when the magnitude of the difference between the amplitude of the received video signal and the amplitude of the output signal of the circuit control means equals or exceeds a predetermined value corresponding substantially to one half the peak-to-peak amplitude value of the noise excursions of the received video signal to be attenuated so that when the control signal is generated the circuit control means output signal has an amplitude difference, with respect to the received video signal, having a magnitude which does not substantially exceed the predetermined value;

circuit filter means having an input to receive the video signal and an output to generate the filtered output signal in response to the received video signal in which small amplitude noise excursions of the video signal are attenuated when the control signal produced by the circuit control means is not generated; and circuit means for combining the output of the circuit control means with the output of the circuit filter means to cooperatively provide the filtered output signal attenuated of the noise characteristics.

* * * * *